(12) United States Patent
DeMonte

(10) Patent No.: US 7,282,996 B2
(45) Date of Patent: Oct. 16, 2007

(54) ELECTRONIC AMPLIFIER WITH SIGNAL GAIN DEPENDENT BIAS

(75) Inventor: Frank J. DeMonte, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 159 days.

(21) Appl. No.: 11/105,752

(22) Filed: Apr. 14, 2005

(65) Prior Publication Data
US 2006/0232339 A1 Oct. 19, 2006

(51) Int. Cl.
*H03G 3/10* (2006.01)
*H03G 3/30* (2006.01)

(52) U.S. Cl. ............................. 330/285; 330/136
(58) Field of Classification Search ............ None
See application file for complete search history.

(56) References Cited

U.S. PATENT DOCUMENTS 5,028,882 A * 7/1991 Marrah et al. ............ 330/254
6,759,906 B2 * 7/2004 Matsunaga et al. ........ 330/285
6,873,208 B2 * 3/2005 Shinjo et al. .............. 330/129
6,933,786 B1 * 8/2005 Mohandas et al. ........ 330/308
7,038,542 B2 * 5/2006 Imayama et al. .......... 330/254

* cited by examiner

*Primary Examiner*—Robert Pascal
*Assistant Examiner*—Alan Wong
(74) *Attorney, Agent, or Firm*—RatnerPrestia

(57) ABSTRACT

An apparatus having an electronic amplifier with signal gain dependent bias. The electronic apparatus includes the amplifier and a bias state control circuit. The electronic amplifier has a signal gain and a bias state. The signal gain is adjustable to either of at least two different signal gain settings, and the bias state is adjustable to either of at least two different bias state settings. The bias state control circuit has capability of adjusting the bias state setting of the amplifier based upon the signal gain setting to which the amplifier is adjusted.

17 Claims, 6 Drawing Sheets

ELECTRONIC AMPLIFIER WITH SIGNAL GAIN DEPENDENT BIAS

BACKGROUND

The level of power dissipation in modern electronic devices is an ongoing concern for designers. It is important for the designer to extend battery life in portable electronic devices, such as digital cameras and cell phones, by controlling power consumption. It is also important to limit the heat dissipated within the integrated circuits used in such portable devices, as well as in other applications. Heat dissipation in an integrated circuit can be a major design and operational constraint. Increasingly, solid state imaging devices such as CMOS and other image sensor arrays used, for example, in digital camera and cell phone modules are being designed to capture images with greater and greater resolution. The capture of images of ever greater resolution has resulted in image sensor chips with increased numbers of pixels on the image sensor arrays and with associated increased pixel densities. The resulting pixel densities and related signal processing circuitry on such chips, as well as the faster clock speeds necessary to capture the higher resolution images within an acceptable time, has resulted in greater power densities dissipated in these image sensor chips.

Each pixel in an image sensor array converts the light hitting it in a fixed period of time into electronic charge which is transferred out of the array in a preselected order and detected as a voltage signal. This analog voltage signal from the array is then converted into a digital signal. Prior to the analog-to-digital (ADC) stage there is often an amplifier with programmable gain that increases lower level signals resultant from lower light level conditions in an attempt to utilize the full range of the ADC stage.

In addition, each pixel typically has a color filter over it so that each pixel is responsive to light only in a given frequency band typically corresponding to either the red, green, or blue colors. In addition to the color filter, the silicon of the pixels converts different frequencies of light with different efficiencies. The conversion efficiency is greater for the red color band than for the blue color band. Thus, the amplification needed for each of the color band signals will be different.

For economic reasons in fabricating integrated circuits it is important to keep the size of the integrated circuit die small. As such, increasing the number of pixels in an image sensor array results in an effort to reduce the size of the individual pixels, so as to keep the overall die size as small as possible. The smaller pixel sizes reduce the light sensitivity of the pixels and cause a need for higher programmable amplifier gains. Higher pixel counts lead to faster system clock speeds in order to be able to capture an image in a desired period of time. Chip heating due to the amplification stages increases as the gain and speed requirements of the amplifiers increase. Localized heating on the integrated circuit die in the region of the image array can cause image artifacts.

Typically when an amplifier is designed, the requirements for the amplifier in terms of gain and frequency response are determined. The amplifier is designed so that it can achieve the desired output settling at the maximum bandwidth (speed of signal capture and processing) while amplifying the signal at the maximum gain setting. If the amplifier can meet this maximum Gain-Bandwidth requirement, then the amplifier is able to handle all other combinations of lower gain and lower bandwidth.

SUMMARY

In representative embodiments, an electronic apparatus having an electronic amplifier with signal gain dependent bias is disclosed. The electronic apparatus comprises the amplifier and a bias state control circuit. The electronic amplifier has a signal gain and a bias state. The signal gain is adjustable to either of at least two different signal gain settings, and the bias state is adjustable to either of at least two different bias state settings. The bias state control circuit has capability of adjusting the bias state setting of the amplifier based upon the signal gain setting to which the amplifier is adjusted.

In other representative embodiments, an electronic apparatus is disclosed that comprises an electronic amplifier having a signal gain and a bias state. The signal gain is adjustable to either of at least two different signal gain settings, and the bias state is adjustable to either of at least two different bias state settings. The bias state setting to which the amplifier is adjusted is dependent upon the signal gain setting to which the amplifier is adjusted.

In still other representative embodiments, a method is disclosed for adjusting a bias state of an electronic amplifier. The method steps comprise receiving a required gain control signal for the electronic amplifier, adjusting signal gain of the electronic amplifier in compliance with the required gain control signal, determining an appropriate bias state setting, and adjusting bias state of the electronic amplifier to the appropriate bias state setting. The signal gain is adjustable to either of at least two different signal gain settings, and the bias state is adjustable to either of at least two different bias state settings. The appropriate bias state setting to which the amplifier is adjusted is dependent upon the signal gain setting to which the amplifier is adjusted.

Other aspects and advantages of the representative embodiments presented herein will become apparent from the following detailed description, taken in conjunction with the accompanying drawings.

BRIEF DESCRIPTION OF THE DRAWINGS

The accompanying drawings provide visual representations which will be used to more fully describe various representative embodiments and can be used by those skilled in the art to better understand them and their inherent advantages. In these drawings, like reference numerals identify corresponding elements.

DETAILED DESCRIPTION

Figure 1:
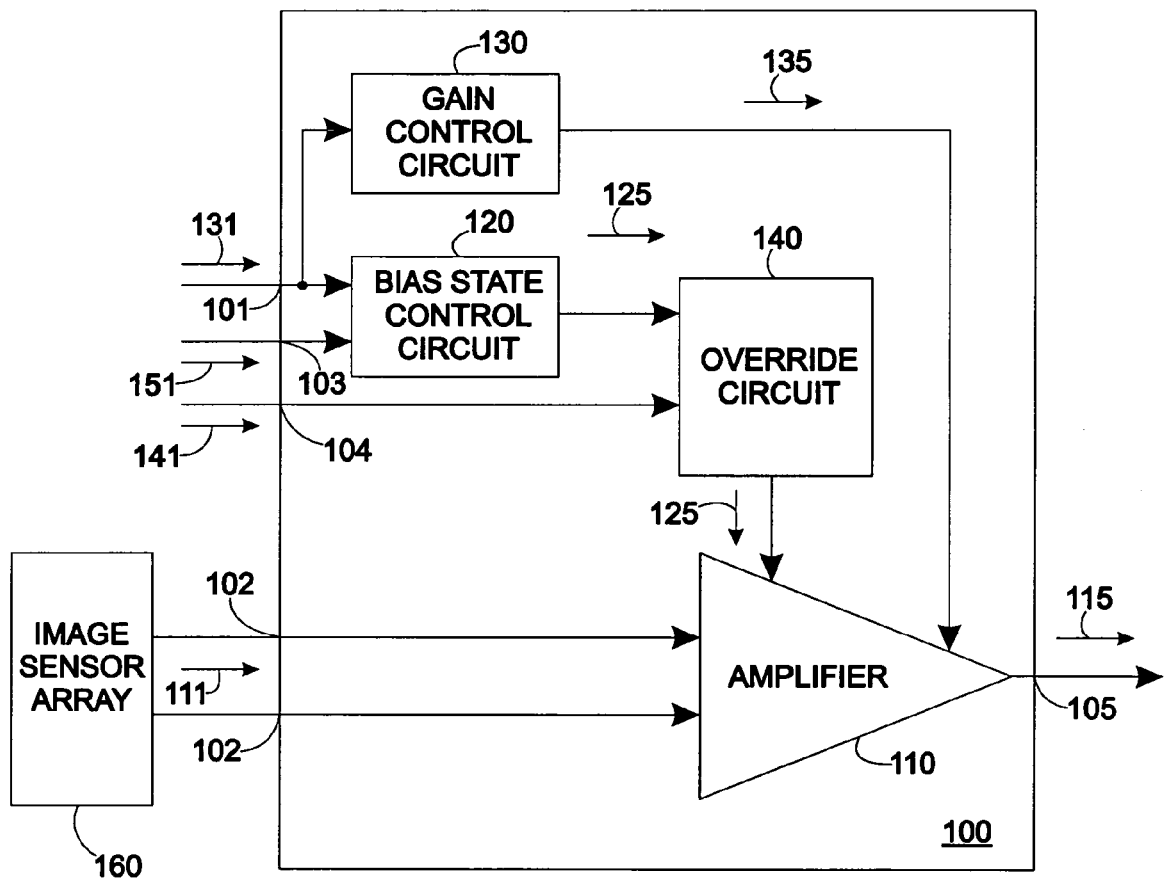
FIG. 1 is a block diagram of an electronic apparatus as described in various representative embodiments.

As shown in the drawings for purposes of illustration, novel amplifiers are disclosed herein wherein the bias state of an amplifier is adjusted in accordance with changes in the gain requirements of the signal path using the amplifier. Such amplifiers will typically dissipate reduced time averaged power.

In the following detailed description and in the several figures of the drawings, like elements are identified with like reference numerals.

In representative embodiments, amplifiers are disclosed having programmable signal gains whose bias states are also programmable based upon the signal gain setting for the amplifier. Previous amplifiers have been designed for the expected maximum signal gain at the maximum bandwidth (speed). As such, the amplifier would be able to handle all lower signal gain and/or bandwidth requirements. But it is the maximum signal gain at the maximum speed that determines the upper level of power needed by the amplifier. As image arrays are becoming larger (up into the megapixel region) increasing system clock speeds (bandwidth), and as pixels are becoming smaller, requiring increases to signal gain, it becomes more important to find ways to reduce the power consumption of the amplifier.

Depending upon the application, the signal gain that is needed can be determined from the conditions in which the system is operating. In particular, for an image sensor, various images can be captured at a number of signal gain settings. The gain can then be programmed into the system with a value that is sufficiently large but which does not drive the amplifier into saturation or into a non-linear region.

The control signal which sets the programmable signal gain of the amplifier can be used to set how strongly biased the amplifier is. In representative embodiments, this can be set manually or automatically. Thus, the amplifier can be designed such that it is powerful enough to handle the most stringent conditions but does not have to operate for any more stringent condition than is currently present. The signal gain and the bias state can be continuously adjusted or adjusted in steps. Typically a system adjustable in steps would be less complicated to design than would be a continuously adjustable. In a representative example, the system could be adjustable at say ¼, ½, ¾, full gain with the bias state adjusted accordingly. So, once the gain steps are determined those can be programmed into decoding gates that will trigger the bias conditions to adjust appropriately. Such adjustment is preferably performed automatically.

A control signal can also be included that will override the bias state level to be adjusted to and lock it to one or any of the allowable conditions. As an example, the system can be locked at full bias (full power level) or any desired fraction thereof. Thus, once the appropriate gain is ascertained and before the corresponding bias state is passed to the amplifier, there is a level of gating that determines whether or not to override that decision and, if so, what level to set the bias state of the amplifier to. This override could be programmed in for automatic inclusion/exclusion for specified conditions or could be manually entered.

In representative embodiments, images captured by image sensor chips comprise not only the light sensitive pixels, but also an analog processing circuit. Once the analog signal has been digitized, digital circuitry (often on the same chip) performs various digital signal processing functions such as balancing color channels, performing image processing algorithms to clean up an image, perform view finding, etc. In view finding mode the system can begin at the minimum gain and examine the digital values obtained for the exposed pixels. The system adjusts the gain upward until the system begins to receive a certain majority of pixel values near the upper count level. This analysis can be performed very rapidly—perhaps 15 times per second. Typically only a portion of the array is used during view finding so that the system can process the data faster to find the appropriate gain. Thus, the system quickly determines how much light is incident upon the image sensor and how much gain is needed. Further, the system can determine the gain needed for each of the separate color channels. This can be a continually acting iterative process. Thus, the gain can be programmed to change as the scene changes. In like manner, the change in gain can be programmed to adjust the bias condition appropriately.

In certain amplifier architectures, the speed at which the amplifier can function is closely related to the bias current flowing in the input and output stages. For these architectures, important points on their frequency response curves are derived from expressions that are first order dependent on these bias currents. If the bias currents are decreased, the amplifier's ability to settle out on a signal slows down, and if the bias currents are increased, the amplifier's response is sped up. Some examples of common architectures that lend themselves to this include current mirror, telescopic cascode, and folded cascode amplifiers.

For example, the unity gain frequency of these types of amplifiers is approximately proportional to the transconductance of the input transistors which itself is proportional to the square root of the bias currents flowing through them. The unity gain frequency of the amplifier is a primary determinate of the amplifier's bandwidth. If this bias current is decreased then the transconductance will be lowered, thereby lowering the unity gain frequency. Another example of speed dependency on bias currents is that the slew rates of these types of amplifiers are directly proportional to the bias currents flowing through the transistors in their output stages.

By operating any amplifier on the image sensor array chip at reduced bias conditions, even if only intermittently, the time averaged power dissipated in the integrated circuit chip can be reduced resulting in increased battery life and in improved images.

In another representative embodiment, an amplifier's signal gain may or may not be programmable. The amplifier is, however, slaved to a particular clock. As such, the faster the clock is running, the faster the amplifier performs its functions. Such an amplifier could be, for example, an amplifier in the ADC which could be a pipeline converter with multiple stages of amplification and conversion. These amplifiers do not actually perform signal amplification like the programmable gain stages, but they have to perform at the necessary ADC conversion speeds and be fast enough to settle out in the time allotted them by the system clock. But, there are times when running the image sensor chip, i.e., the camera, that the system is not running at the maximum clock speed, and it is, therefore, possible to slow the clock speed down on the analog side. As such, the bias current settings, and thus the power, could be reduced on those amplifiers when maximum speed is not required. These amplifiers bias's are speed programmable, if not gain programmable. So, if the system is running at a data rate of half the maximum data rate, those amplifiers could be biased to run at reduced power levels.

While representative embodiments discussed herein comprise image sensor arrays with associated amplifiers and digital processing circuitry, these embodiments are presented by way of example and not by way of limitation. It will be understood by those skilled in the art that the present teachings can be employed in amplifiers used in a wide variety of applications other than those discussed herein.

FIG. 1 is a block diagram of an electronic apparatus 100 as described in various representative embodiments. In FIG. 1, the electronic apparatus 100 comprises an electronic amplifier 110, also referred to herein as an amplifier 110, a bias state control circuit 120, a signal path gain control circuit 130, also referred to herein as a gain control circuit 130, and an override circuit 140. The amplifier could be the differential input amplifier 110 shown in FIG. 1 or alternatively a single-ended input amplifier 110. The bias state control circuit 120 receives a required gain control signal 131 at first input 101 of the electronic apparatus 100, the gain control circuit 130 also receives the required gain control signal 131 at first input 101 of the electronic apparatus 100, and the amplifier receives an input signal 111 at second input 102 (single-ended or differential), which is also referred to herein as amplifier input 102 and which could be a differential input signal 111 or a single-ended input signal 111, of the electronic apparatus 100. In addition, the bias state control circuit 120 receives an optional required bandwidth control signal 151 at third input 103. In response to the input signal 111, the electronic apparatus 100 outputs output signal 115 at output 105 of the electronic apparatus 100. The override circuit 140 receives an optional override signal 141 at fourth input 104 of the electronic apparatus 100.

In operation, input signal 111 is received by amplifier 110 at amplifier inputs 102 from an image sensor array 160. Input signal 111 is transformed by amplifier 110 into output signal 115 at output 105, wherein the signal gain of the amplifier 110 has been set by the gain control circuit 130. Amplifier 110 has characteristics initially specified by the design of the amplifier 110 for maximum signal path gain and speed (bandwidth) and modifiable via bias state control circuit 120. In response to the required gain control signal 131 received at first input 101, the gain control circuit 130 adjusts the signal path gain performed by the amplifier 110 via gain setting signal 135. In response to the required gain control signal 131 received at first input 101 and optionally in response to the required bandwidth control signal 151 received at the third input 103, the bias state control circuit 120 sends a control signal to the override circuit 140 for transmission to the amplifier 110 to adjust the bias state of the amplifier via bias state setting signal 125. The bias state setting signal 125 can be optionally modified by the override circuit 140 in accordance with the override signal 141. In effect, the override circuit 140 can either pass the bias state setting signal 125 unchanged to the amplifier 110 or it can force the bias state setting signal 125 to assume a fixed value in accordance with the override signal 141. Power consumed by the amplifier 110 is changed based on the bias state setting to which the amplifier 110 has been adjusted. The bias state control circuit 120 adjusts the bias state of the amplifier 110 to both maintain sufficient bandwidth based on the required bandwidth control signal 151 and to attain a lower power dissipation consistent with the bandwidth requirement.

Figure 2A:
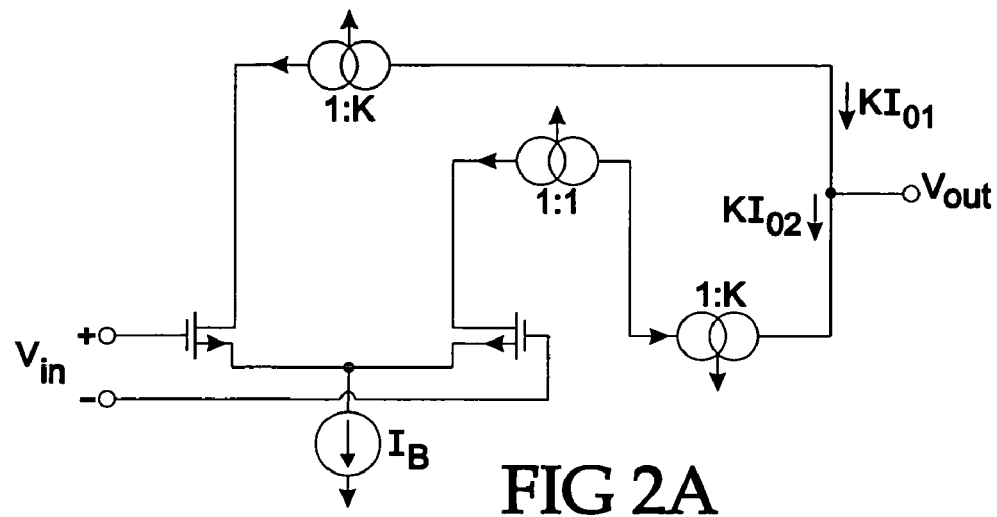
FIG. 2A is a block diagram of an electronic amplifier as described in various representative embodiments.

FIG. 2A is a block diagram of an electronic amplifier 110 as described in various representative embodiments. The amplifier 110 of FIG. 2A is a current mirror amplifier 110. The bias setting of the current mirror amplifier 110 can be adjusted by adjustment of bias current $I_B$. $V_{IN}$ of FIG. 2A corresponds to input signal 111 of FIG. 1, and $V_{OUT}$ of FIG. 2A corresponds to output signal 115 of FIG. 1.

Figure 2B:
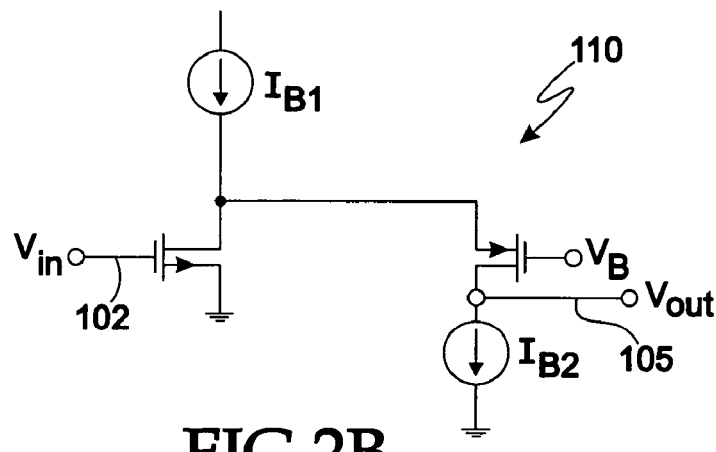
FIG. 2B is a block diagram of another electronic amplifier as described in various representative embodiments.

FIG. 2B is a block diagram of another electronic amplifier 110 as described in various representative embodiments. The amplifier 110 of FIG. 2B is a folded-cascode amplifier 110. The bias setting of the folded-cascode amplifier 110 can be adjusted by adjustment of bias currents $I_{B1}$ and $I_{B2}$, as well as bias voltage $V_B$. $V_{IN}$ of FIG. 2B corresponds to input signal 111 of FIG. 1, and $V_{OUT}$ of FIG. 2B corresponds to output signal 115 of FIG. 1.

Figure 2C:
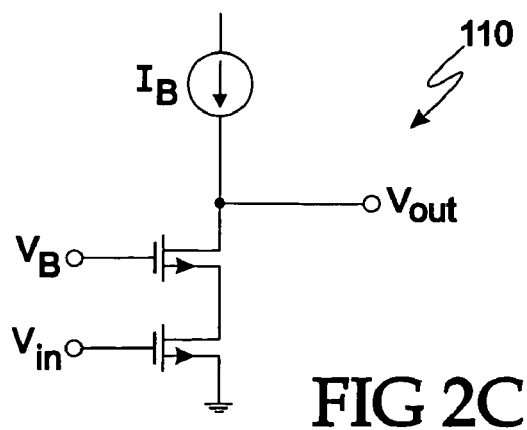
FIG. 2C is a block diagram of yet another electronic amplifier as described in various representative embodiments.

FIG. 2C is a block diagram of yet another electronic amplifier 110 as described in various representative embodiments. The amplifier 110 of FIG. 2C is a telescopic-cascode amplifier 110. The bias setting of the telescopic-cascode amplifier 110 can be adjusted by adjustment of bias current $I_B$, as well as bias voltage $V_B$. $V_{IN}$ of FIG. 2C corresponds to input signal 111 of FIG. 1, and $V_{OUT}$ of FIG. 2C corresponds to output signal 115 of FIG. 1.

Figure 3:
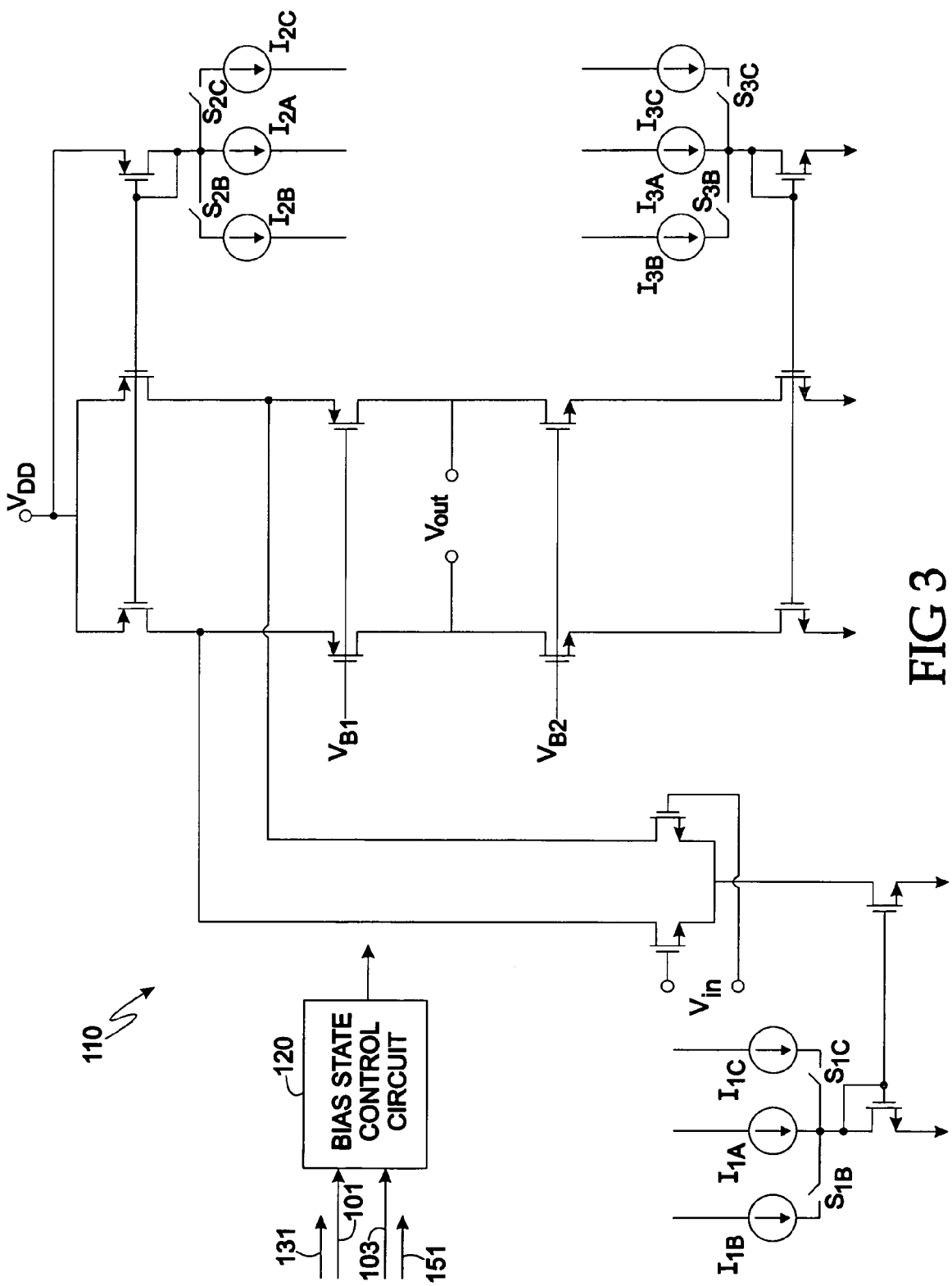
FIG. 3 is a block diagram of still another electronic amplifier as described in various representative embodiments.

FIG. 3 is a block diagram of still another electronic amplifier 110 as described in various representative embodiments. The amplifier 110 of FIG. 3 is a more extensive folded-cascode amplifier 110 than that of FIG. 2B. In FIG. 3, the bias state control circuit 120 opens and closes switches $S_{1B}$, $S_{1C}$, $S_{2B}$, $S_{2C}$, $S_{3B}$, and $S_{3C}$ to adjust the bias condition setting of the folded-cascode amplifier 110 by adding and removing the bias currents from current sources $I_{1B}$, $I_{1C}$, $I_{2B}$, $I_{2C}$, $I_{3B}$, and $I_{3C}$ respectively. $V_{IN}$ of FIG. 3 corresponds to input signal 111 of FIG. 1, and $V_{OUT}$ of FIG. 3 corresponds to output signal 115 of FIG. 1.

Figure 4A:
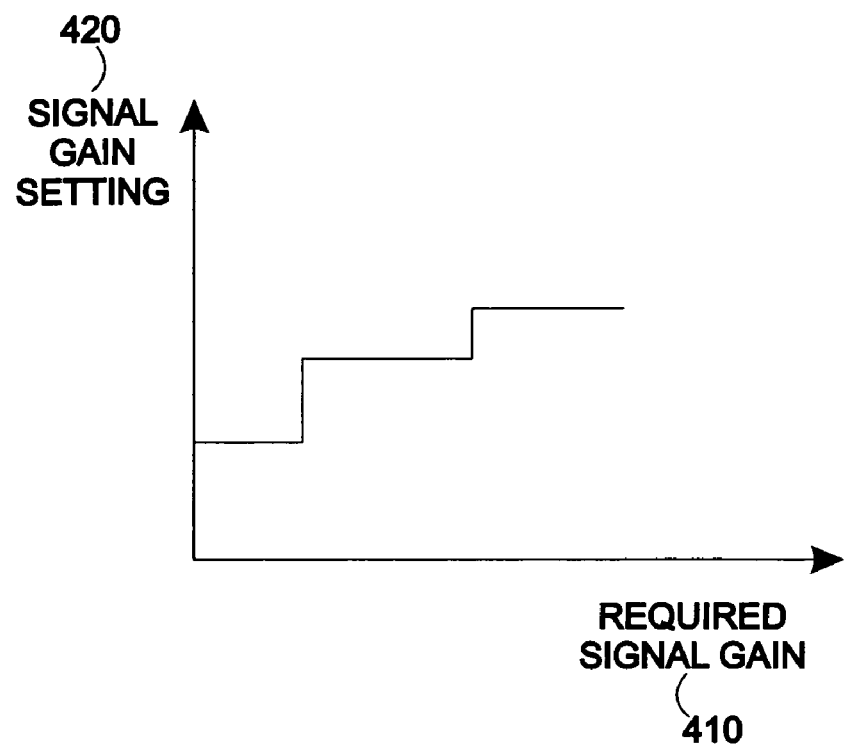
FIG. 4A is a plot of the gain of the amplifier vs. the required gain as described in various representative embodiments.

FIG. 4A is a plot of signal gain setting 420 of the amplifier 110 vs. required signal gain 410 as described in various representative embodiments. Note that in FIG. 4A the gain of the amplifier is adjusted in steps dependent upon the required gain. However, such adjustment could be made continuously dependent upon the required gain.

Figure 4B:
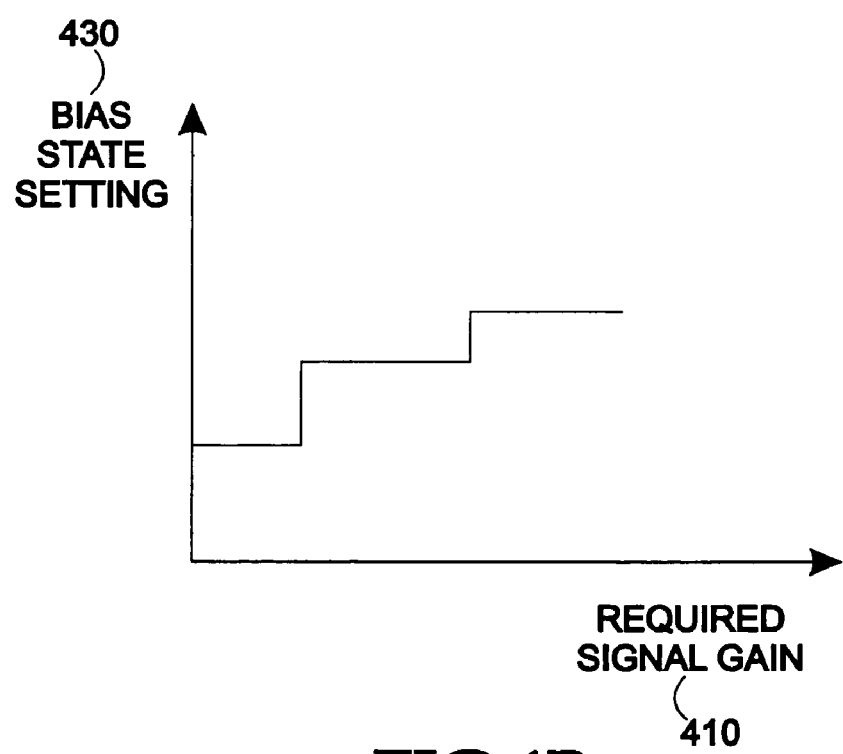
FIG. 4B is a plot of the bias state setting of the amplifier vs. the required gain as described in various representative embodiments.

FIG. 4B is a plot of bias state setting 430 of the amplifier 110 vs. the required signal gain 410 as described in various representative embodiments. Note that in FIG. 4B the bias state setting 430 of the amplifier 110 is adjusted in steps dependent upon the required signal gain 410. However, such adjustment could be made continuously dependent upon the required signal gain 410. Also, further adjustment may be necessary dependent upon the required bandwidth of the amplifier 110 as previously described and as indicated below with respect to FIG. 4C.

Figure 4C:
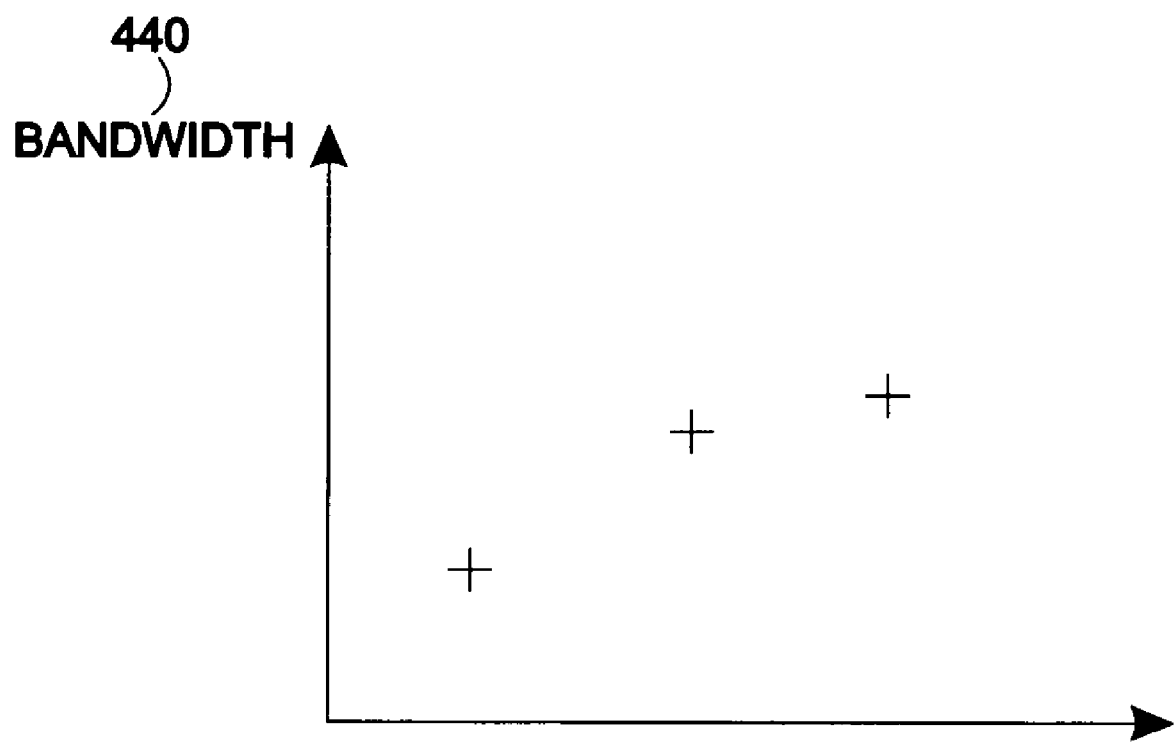
FIG. 4C is a plot of the bias state setting of the amplifier vs. the bandwidth of the amplifier as described in various representative embodiments.

FIG. 4C is a plot of the bias state setting 430 of the amplifier 110 vs. bandwidth 440 of the amplifier 110 as described in various representative embodiments. Note that in FIG. 4C it has been assumed that the bandwidth of the amplifier 110 is dependent upon the bias state 430 of the amplifier 110 and that the bias state setting 430 of the amplifier 110 is adjusted in steps dependent upon the required signal gain 410 with consideration of the required bandwidth. In other words, FIG. 4C assumes that bias state 430 has been set such that the bandwidth 440 of the system is greater than the required bandwidth. The results of these assumptions are the discrete points of FIG. 4C. However, bandwidth considerations are not necessary for any case in which the bandwidth 440 is not dependent upon and may not be for cases in which the bandwidth 440 is only weakly dependent upon the bias state 430 of the amplifier.

Figure 5:
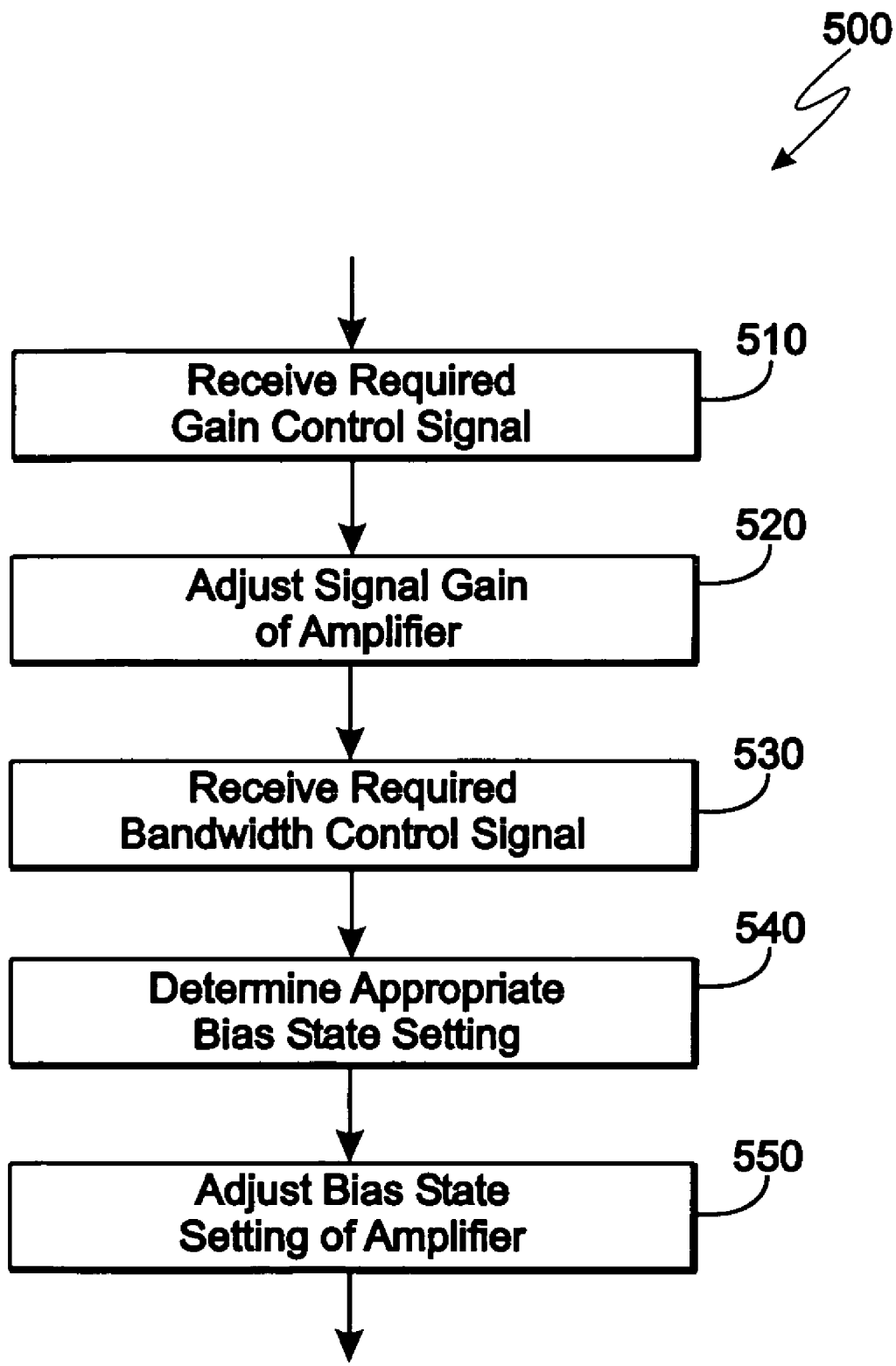
FIG. 5 is a flow chart of a method for adjusting the bias state of the amplifier as described in various representative embodiments.

FIG. 5 is a flow chart of a method 500 for adjusting the bias state of the amplifier 110 as described in various representative embodiments. In block 510, the required gain control signal 131 is received by the bias state control circuit 120 and the gain control circuit 130. Block 510 then transfers control to block 520.

In block 520, the signal gain 420 of the amplifier 110 is adjusted in compliance with the required gain control signal 131. The signal gain 420 of the amplifier 110 can be adjusted either continuously or in a limited steps. The signal gain 420 is adjustable to any one of at least two different gain settings. Further, the signal gain 420 of the amplifier 110 may be either manually or automatically adjusted based on a characteristic of an input signal 111 to the amplifier 110 which characteristic may be the maximum expected magnitude. Block 520 then transfers control to block 530.

In block 530, the required bandwidth control signal 151 is optionally received by the bias state control circuit 120. Block 530 then transfers control to block 540.

In block 540, the appropriate bias state setting 430 is determined in accordance with the required gain control signal 131 and optionally in compliance with the required bandwidth control signal 151. Block 540 then transfers control to block 550.

In block 550, the bias state of the amplifier 110 is adjusted to that of the appropriate bias state setting 430, wherein the bias state is adjustable to either of at least two different bias state settings 430 and wherein the appropriate bias state setting 430 to which the amplifier 110 is adjusted is dependent upon the gain setting to which the amplifier 110 is adjusted. The bias state setting 430 can be either continuously adjustable or adjustable in steps. Block 550 then terminates the process.

As is the case, in many data-processing products, the systems described above may be implemented as a combination of hardware and software components. Moreover, the functionality required for use of the representative embodiments may be embodied in computer-readable media (such as floppy disks, conventional hard disks, DVD's, CD-ROM's, Flash ROM's, nonvolatile ROM, and RAM) to be used in programming an information-processing apparatus (e.g., the electronic apparatus 100 comprising the elements shown in FIG. 1 among others) to perform in accordance with the techniques so described.

The term "program storage medium" is broadly defined herein to include any kind of computer memory such as, but not limited to, floppy disks, conventional hard disks, DVD's, CD-ROM's, Flash ROM's, nonvolatile ROM, and RAM.

An advantage of the embodiments as described herein is the ability to reduce the power dissipated in the electronic apparatus 100 which is typically an integrated circuit chip and can result in a lower thermal load thereon with potentially improved performance as well as lower battery drain.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. An electronic apparatus, comprising:
   an electronic amplifier having a signal gain and a bias state, wherein the signal gain is adjustable to either of at least two different signal gain settings and wherein the bias state is adjustable to either of at least two different bias state settings;
   a bias state control circuit, wherein the bias state control circuit has capability of adjusting the bias state setting of the amplifier based upon the signal gain setting to which the amplifier is adjusted, and,
   a gain control circuit, wherein the gain control circuit is separate from the bias state control circuit and has capability of separately adjusting the signal gain setting of the amplifier, wherein the bias state control circuit is configured to adjust the bias state of the amplifier based upon a bandwidth control signal inputted to the bias state control circuit, and
   the gain control circuit is configured to adjust the signal gain of the amplifier based upon a gain control signal inputted to the gain control circuit.

2. The electronic apparatus as recited in claim 1, wherein the bias state setting is automatically adjusted.

3. An electronic apparatus comprising:
   an electronic amplifier having a signal gain and a bias state, wherein the signal gain is adjustable to either of at least two different signal gain settings and wherein the bias state is adjustable to either of at least two different bias state settings; and
   a bias state control circuit, wherein the bias state control circuit has capability of adjusting the bias state setting of the amplifier based upon the signal gain setting to which the amplifier is adjusted,
   wherein the bias state setting is automatically adjusted,
   wherein the signal gain is automatically adjusted based on a characteristic of an input signal to the amplifier, wherein the input signal has a maximum expected magnitude, and wherein the characteristic of the input signal upon which the signal gain is automatically adjusted is the maximum expected magnitude.

4. The electronic apparatus as recited in claim 3, wherein the amplifier is selected from the group of amplifiers consisting of current mirror amplifiers, folded cascode amplifiers, and telescopic cascode amplifiers.

5. The electronic apparatus as recited in claim 3, wherein the electronic apparatus further comprises an image sensor array and wherein an input signal to the amplifier results from an output signal from the image sensor array.

6. The electronic apparatus as recited in claim 3, wherein the amplifier is selected from the group of amplifiers consisting of single-ended input amplifiers and differential input amplifiers.

7. The electronic apparatus as recited in claim 3, wherein a bandwidth to which the amplifier is adjusted is set automatically as the bias state setting is set.

8. An electronic apparatus comprising:
   an electronic amplifier having a signal gain and a bias state, wherein the signal gain is adjustable to either of at least two different signal gain settings and wherein the bias state is adjustable to either of at least two different bias state settings; and
   a bias state control circuit, wherein the bias state control circuit has capability of adjusting the bias state setting of the amplifier based upon the signal gain setting to which the amplifier is adjusted,
   wherein the signal gain is automatically adjusted based on a characteristic of an input signal to the amplifier, wherein the input signal has a maximum expected magnitude, and wherein the characteristic of the input signal upon which the signal gain is automatically adjusted is the maximum expected magnitude.

9. An electronic apparatus comprising:
   an electronic amplifier having a signal gain and a bias state, wherein the signal gain is adjustable to either of at least two different signal gain settings, wherein the bias state is adjustable to either of at least two different bias state settings, and wherein the bias state setting to which the amplifier is adjusted is dependent upon the signal gain setting to which the amplifier is adjusted, wherein the bias state setting is automatically adjusted, wherein the signal gain is automatically adjusted based on a characteristic of an input signal to the amplifier, wherein the input signal has a maximum expected magnitude, and wherein the characteristic of the input signal upon which the signal gain is automatically adjusted is the maximum expected magnitude.

10. The electronic apparatus as recited in claim 9, wherein the amplifier is selected from the group of amplifiers consisting of current mirror amplifiers, folded cascode amplifiers, and telescopic cascode amplifiers.

11. The electronic apparatus as recited in claim 9, wherein the electronic apparatus further comprises an image sensor array and wherein an input signal to the amplifier results from an output signal from the image sensor array.

12. The electronic apparatus as recited in claim 9, wherein the amplifier is selected from the group of amplifiers consisting of single-ended input amplifiers and differential input amplifiers.

13. The electronic apparatus as recited in claim 9, wherein a bandwidth to which the amplifier is adjusted is set automatically as the bias state setting is set.

14. An electronic apparatus comprising:
an electronic amplifier having a signal gain and a bias state, wherein the signal gain is adjustable to either of at least two different signal gain settings, wherein the bias state is adjustable to either of at least two different bias state settings, and wherein the bias state setting to which the amplifier is adjusted is dependent upon the signal gain setting to which the amplifier is adjusted,
wherein the signal gain is automatically adjusted based on a characteristic of an input signal to the amplifier, wherein the input signal has a maximum expected magnitude, and wherein the characteristic of the input signal upon which the signal gain is automatically adjusted is the maximum expected magnitude.

15. A method for adjusting a bias state of an electronic amplifier, comprising:
receiving a required gain control signal for the electronic amplifier;
adjusting signal gain of the electronic amplifier in compliance with the required gain control signal, wherein signal gain is adjustable to either of at least two different signal gain settings;
determining appropriate bias state setting;
adjusting bias state of the electronic amplifier to the appropriate bias state setting, wherein the bias state is adjustable to either of at least two different bias state settings and wherein the appropriate bias state setting to which the amplifier is adjusted is dependent upon the signal gain setting to which the amplifier is adjusted;
wherein the signal gain is automatically adjusted based on a characteristic of an input signal to the amplifier, wherein the input signal has a maximum expected magnitude, and wherein the characteristic of the input signal upon which the signal gain is automatically adjusted is the maximum expected magnitude.

16. The method as recited in claim 15, wherein the bias state setting is automatically adjusted.

17. The method as recited in claim 15, wherein an input of the amplifier is attached to an image sensor array and wherein an input signal to the amplifier results from an output signal from the image sensor array.

* * * * *